(12) United States Patent
Wang et al.

(10) Patent No.: US 9,331,200 B1
(45) Date of Patent: May 3, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Lanxiang Wang, Singapore (SG); Hong Liao, Singapore (SG); Chao Jiang, Singapore (SG); Duan Quan Liao, Singapore (SG); Ye Chao Li, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/590,008

(22) Filed: Jan. 6, 2015

(30) Foreign Application Priority Data

Dec. 19, 2014 (CN) .......................... 2014 1 0799048

(51) Int. Cl.
*H01L 29/78* (2006.01)
*H01L 29/66* (2006.01)
*H01L 29/417* (2006.01)
*H01L 29/161* (2006.01)
*H01L 29/45* (2006.01)

(52) U.S. Cl.
CPC .......... *H01L 29/7848* (2013.01); *H01L 29/161* (2013.01); *H01L 29/41783* (2013.01); *H01L 29/45* (2013.01); *H01L 29/665* (2013.01); *H01L 29/66568* (2013.01)

(58) Field of Classification Search
CPC ......... H01L 21/02; H01L 21/20; H01L 21/36; H01L 21/336; H01L 21/8234; H01L 21/8256; H01L 27/092; H01L 29/06; H01L 29/78; H01L 29/775
See application file for complete search history.

(56) References Cited

U.S. PATENT DOCUMENTS

| | | | |
|---|---|---|---|
| 2010/0193882 A1* | 8/2010 | Hoentschel | H01L 29/165 257/410 |
| 2014/0053894 A1 | 2/2014 | Roucka et al. | |
| 2014/0197376 A1 | 7/2014 | Ma et al. | |
| 2014/0239416 A1 | 8/2014 | Hsiao et al. | |

* cited by examiner

*Primary Examiner* — Kyoung Lee
(74) *Attorney, Agent, or Firm* — Winston Hsu; Scott Margo

(57) ABSTRACT

A method for fabricating semiconductor device is disclosed. The method includes the steps of: providing a substrate having a gate structure thereon; and forming a first epitaxial layer, a second epitaxial layer, and a silicide layer in the substrate adjacent to the gate structure. Preferably, the first epitaxial layer, the second epitaxial layer, and the silicide layer comprise SiGeSn.

11 Claims, 2 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming epitaxial layers containing SiGeSn alloys.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Despite the aforementioned approach improves the carrier mobility in the channel region, strain of the device cannot be increased significantly as the size of the device decreases to lower electrical resistance in the source/drain region and reach desirable driving current. Hence, how to improve the current fabrication flow has become an important task in this field.

SUMMARY OF THE INVENTION

According to a preferred embodiment of the present invention, a method for fabricating semiconductor device is disclosed. The method includes the steps of: providing a substrate having a gate structure thereon; and forming a first epitaxial layer, a second epitaxial layer, and a silicide layer in the substrate adjacent to the gate structure. Preferably, the first epitaxial layer, the second epitaxial layer, and the silicide layer comprise SiGeSn.

According to another aspect of the present invention, a semiconductor device is disclosed. The semiconductor device includes: a substrate having a gate structure thereon; a first epitaxial layer in the substrate adjacent to the gate structure; a second epitaxial layer on the first epitaxial layer; and a silicide layer on the second epitaxial layer, wherein the first epitaxial layer, the second epitaxial layer, and the silicide layer comprise SiGeSn.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
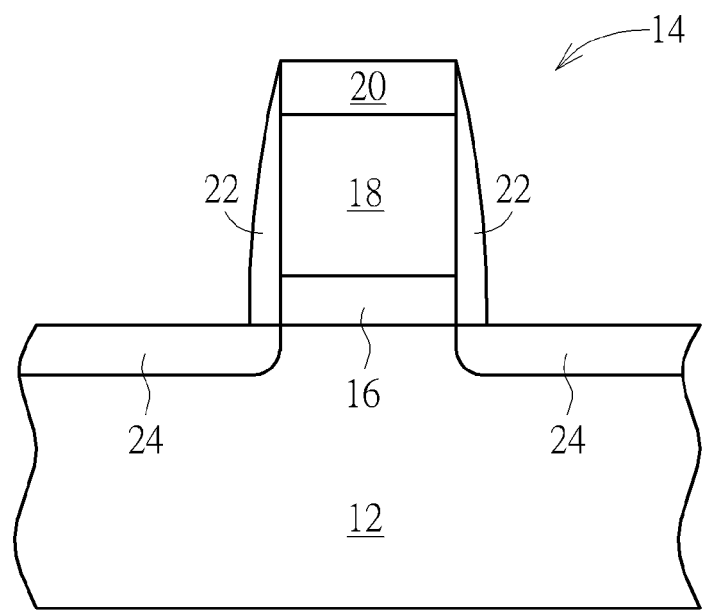
FIGS. 1-4 illustrate a method for fabricating semiconductor device according to a preferred embodiment of the present invention.

Referring to FIGS. 1-4, FIGS. 1-4 illustrate a method for fabricating semiconductor device according to a preferred embodiment of the present invention. As shown in FIG. 1, a substrate 12 is first provided, and at least one gate structure 14 is formed on the substrate 12. In this embodiment, the formation of the gate structure 14 could be accomplished by sequentially forming a gate dielectric layer, a gate material layer, and a hard mask on the substrate 12, conducting a pattern transfer process by using a patterned resist (not shown) as mask to partially remove the hard mask, gate material layer, and gate dielectric layer through single or multiple etching processes, and stripping the patterned resist for forming a gate structure 14 on the substrate 12. Preferably, the gate structure 14 is composed of a patterned gate dielectric layer 16, a patterned gate material layer 18, and a patterned hard mask 20 and despite only a single gate structure 14 is disclosed in this embodiment, the quantity of the gate structure 14 is not limited two.

According to an embodiment of the present invention, the substrate 12 could be a semiconductor substrate including silicon substrate, epitaxial substrate, silicon carbide substrate, or silicon-on-insulator (SOI) substrate, but not limited thereto. The gate dielectric layer 16 could be composed of silicon dioxide ($SiO_2$), silicon nitride, or high dielectric constant material. The gate material layer 18 could be composed of conductive material such as metal, polysilicon, or silicides. The hard mask 20 could be composed of silicon dioxide, silicon nitride, silicon carbide, or silicon oxynitride, but not limited thereto. Moreover, the hard mask 20 could further include a first hard mask and a second hard mask, in which each of them could include silicon oxide and/or silicon nitride, which is within the scope of the present invention.

According to an embodiment of the present invention, a plurality of doped wells (not shown) or a plurality of shallow trench isolations (STIs) could also be formed in the substrate 12. Also, it should be noted that even though the fabrication process of this embodiment is applied to a planar type transistor, the fabrication process could also be applied to non-planar transistor such as FinFET, and in such instance, the element 12 shown in FIG. 1 would then become a fin-shaped structure on a substrate.

Next, a spacer, such as an offset spacer 22, is formed on the sidewall of the gate structure 14, and a lightly doped implantation process is selectively conducted and then using a rapid thermal anneal process of approximately 930° C. to activate the dopants implanted into the substrate 12. This forms a lightly doped drain 24 in the substrate 12 adjacent to two sides of the offset spacer 22.

Figure 2:
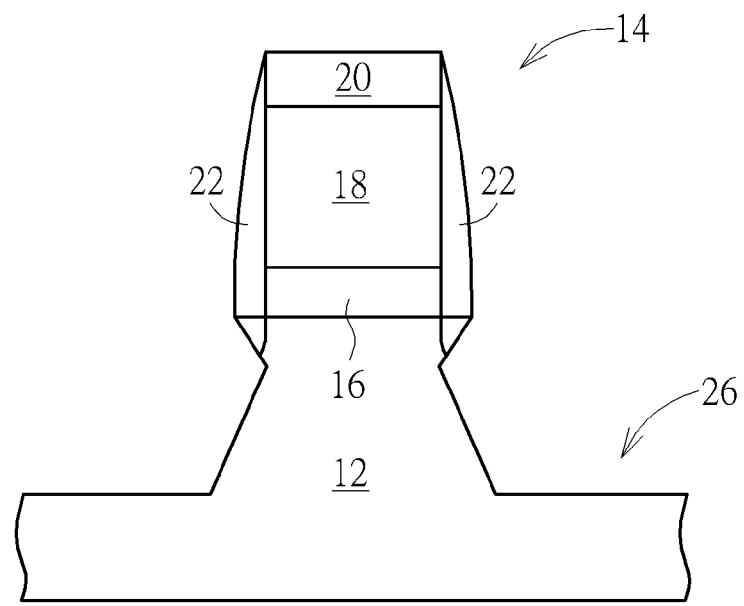

Next, as shown in FIG. 2, a dry and/or wet etching process is conducted by using the gate structure 14 and offset spacer 22 as mask to remove the substrate 12 along the offset spacer 22 through single or multiple etching process for forming a recess 26 in the substrate 12 adjacent to the gate structures 14.

Figure 3:
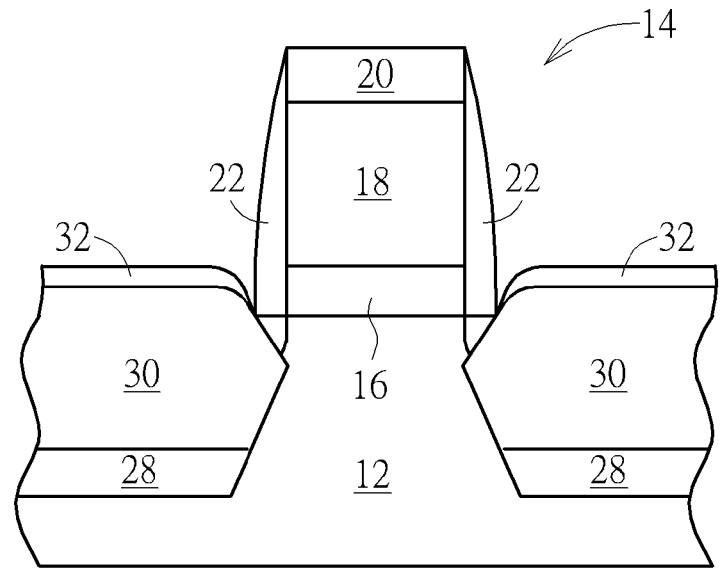

Next, as shown in FIG. 3, a selective epitaxial growth (SEG) process is conducted by first forming a first epitaxial layer 28 in the recess 26, and then sequentially forming a second epitaxial layer 30 on the first epitaxial layer 28 and a third epitaxial layer 32 on the second epitaxial layer 30. In this embodiment, the first epitaxial layer 28, the second epitaxial layer 30, and the third epitaxial layer 32 all includes SiGeSn alloy or compounds, in which the content of Ge and Sn in the second epitaxial layer 30 is preferably higher than the content of Ge and Sn in the first epitaxial layer 28 and third epitaxial layer 32. More specifically, the content of Ge and Sn in the first epitaxial layer 28 is preferably between 15-30 atomic percentage, the content of Ge and Sn in the second epitaxial layer 30 is between 50-80 atomic percentage, and the content of Ge and Sn in the third epitaxial layer 32 is between 15-30 atomic percentage.

It should be noted that since the device of this embodiment pertains to a PMOS transistor, the first epitaxial layer 28, second epitaxial layer 30, and third epitaxial layer 32 are preferably composed of SiGe epitaxial structures, but not limited thereto. In addition, it would also be desirable to conduct an in-situ p+ doping process while forming the first epitaxial layer 28, the second epitaxial layer 30, or the third epitaxial layer 32 to form SiGe epitaxial structures containing p-type dopants. By doing so, the SiGe epitaxial structure with p-type dopants could be used as source/drain region directly and typical ion implants conducted either before or after for forming source/drain region could be omitted. In another embodiment of the present invention, it would also be desirable to use single layer or multi-layer approach for conducting the aforementioned SEG process, and the concentration gradient of the germanium and/or p-type dopants could be formed by having the concentration increased upward, but not limited thereto.

Figure 4:
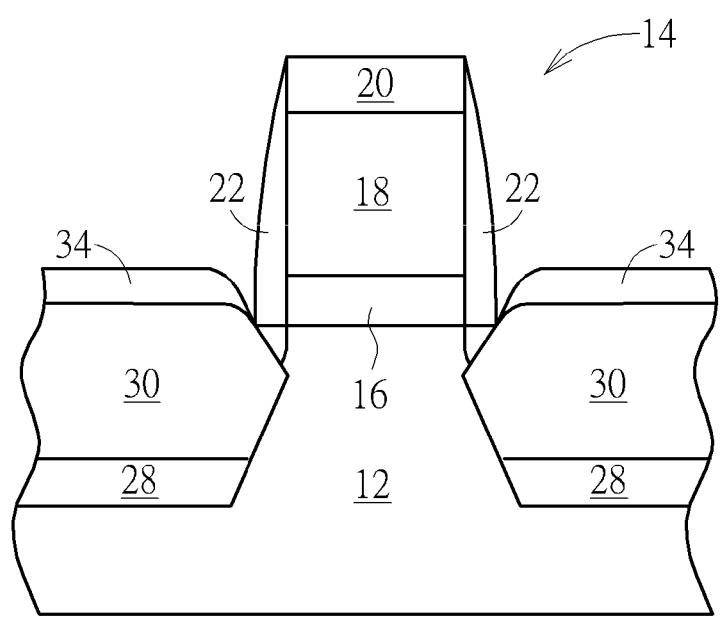

Next, as shown in FIG. 4, a silicide process is conducted by first covering a metal layer (not shown) selected from material consisting of Co, Ti, and Ni on the surface of third epitaxial layer 32, and the metal layer is then reacted with the third epitaxial layer 32 via high temperature to transform into a silicide layer 34. According to a preferred embodiment of the present invention, the silicide process preferably consumes the third epitaxial layer 32 completely so that the third epitaxial layer 32 is transformed into silicide layer 34 completely without affecting the second epitaxial layer 30 and first epitaxial layer 28 underneath. In other words, a first epitaxial layer 28, second epitaxial layer 30 on the first epitaxial layer 28, and a silicide layer 34 on the second epitaxial layer 30 are formed in the substrate 12 adjacent to the gate structure 14 after the silicide process, in which all of the first epitaxial layer 28, second epitaxial layer 30, and silicide layer 34 comprise SiGeSn alloy, and that the content of Ge and Sn in the second epitaxial layer 30 is preferably higher than the content of Ge and Sn in the first epitaxial layer 28 and silicide layer 34. More specifically, the first epitaxial layer 28 and second epitaxial layer 30 preferably include SiGeSn alloy while the silicide layer 34 preferably includes Ni(SiGeSn) alloy if nickel were used as the designated metal in the silicide process, in which the content of Ge and Sn in the first epitaxial layer is between 15-30 atomic percentage, the content of Ge and Sn in the second epitaxial layer 30 is between 50-80 atomic percentage, and the content of Ge and Sn in the silicide layer 34 is between 15-30 atomic percentage. This completes the fabrication of a semiconductor device according to a preferred embodiment of the present invention.

It should be noted that in alternative to the aforementioned embodiment of transforming the third epitaxial layer 32 into silicide layer 34 completely, it would also be desirable to only transform part of the third epitaxial layer 32 into silicide layer 34 according to an embodiment of the present invention. By doing so, a structure having a first epitaxial layer 28 disposed in the substrate 12 adjacent to two sides of the gate structure 14, a second epitaxial layer 30 disposed on the first epitaxial layer 28, and a third epitaxial layer 32 and silicide layer 34 disposed on the second epitaxial layer 30 at the same time could be produced, in which the first epitaxial layer 28, second epitaxial layer 30, third epitaxial layer 32, and silicide layer 34 all includes SiGeSn alloy and the content of Ge and Sn in the second epitaxial layer 30 is higher than the content of Ge and Sn in the first epitaxial layer 28 and silicide layer 34.

Next, typical transistor fabrication process could be carried out by forming a main spacer on sidewall of the gate structure 14, and then forming a source/drain region in the substrate 12 adjacent to two sides of the main spacer. Elements including contact etch stop layer (CESL) and interlayer dielectric (ILD) layer could be formed thereafter, and a replacement metal gate process could also be conducted to transform the gate structure 14 into metal gate. As these processes are well known to those skilled in the art, the details of which are not explained herein for the sake of brevity.

In alternative to the aforementioned embodiment of transforming the third epitaxial layer 32 into silicide layer 34 completely, it would also be desirable to form an ILD layer on the gate structure 14 and third epitaxial layer 32, form contact holes in the ILD layer, and fill the contact holes with metals to form a silicide layer. In this case, the silicide layer would only be formed on part of the third epitaxial layer 32 surface, which is also within the scope of the present invention.

Overall, the present invention preferably forms a recess in the substrate adjacent to two sides of the gate structure, sequentially forms a first epitaxial layer, a second epitaxial layer, and a third epitaxial layer in the recess, and then conducts a silicide process to completely transforms the third epitaxial layer into a silicide layer thereby forming a silicide layer atop two epitaxial layers adjacent to the gate structure. According to a preferred embodiment of the present invention, all of the silicide layer and the two epitaxial layers formed by the aforementioned process include SiGeSn alloy, in which the tin atoms in the alloy typically carries higher lattice constant and lower band gap than silicon and germanium. As an increase in lattice constant could boost up the strain applied to the channel region of a transistor device while lowering of band gap could lower resistance in the source/drain region thereby increasing drive current, it would be desirable to use first epitaxial layer from the integrated tri-layer structure of SiGeSn to lower defect generated between epitaxial layer and the substrate, use the second epitaxial layer in the middle to increase strain in the channel region and lower resistance in the source/drain region, and use the top third epitaxial layer to improve thermal stability in a silicide process as well as facilitate the formation of silicide layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a gate structure thereon; and
   forming a first epitaxial layer, a second epitaxial layer, and a silicide layer in the substrate adjacent to the gate structure, wherein the first epitaxial layer, the second epitaxial layer, and the silicide layer comprise SiGeSn, and the content of Ge and Sn in the first epitaxial layer is between 15-30 atomic percentage.

2. The method of claim 1, further comprising:
   forming a spacer adjacent to the gate structure;
   forming a recess in the substrate adjacent to the spacer;
   forming the first epitaxial layer in the recess;
   forming the second epitaxial layer on the first epitaxial layer;
   forming a third epitaxial layer on the second epitaxial layer; and
   performing a silicide process to transform the third epitaxial layer into the silicide layer.

3. The method of claim 2, further comprising performing in-situ p+ doping process while forming the first epitaxial layer, the second epitaxial layer, or the third epitaxial layer.

4. The method of claim 1, wherein the content of Ge and Sn in the second epitaxial layer is between 50-80 atomic percentage.

5. The method of claim 1, wherein the content of Ge and Sn in the third epitaxial layer is between 15-30 atomic percentage.

6. The method of claim 1, wherein the silicide layer comprises Ni(SiGeSn).

7. A semiconductor device, comprising:
a substrate having a gate structure thereon;
a first epitaxial layer in the substrate adjacent to the gate structure;
a second epitaxial layer on the first epitaxial layer; and
a silicide layer on the second epitaxial layer, wherein the first epitaxial layer, the second epitaxial layer, and the silicide layer comprise SiGeSn, and the content of Ge and Sn in the first epitaxial layer is between 15-30 atomic percentage.

8. The semiconductor device of claim 7, further comprising:
a spacer adjacent to the gate structure;
the first epitaxial layer in the substrate adjacent to the spacer;
the second epitaxial layer on the first epitaxial layer; and
the silicide layer on the second epitaxial layer.

9. The semiconductor device of claim 7, wherein the content of Ge and Sn in the second epitaxial layer is between 50-80 atomic percentage.

10. The semiconductor device of claim 7, wherein the content of Ge and Sn in the third epitaxial layer is between 15-30 atomic percentage.

11. The semiconductor device of claim 7, wherein the silicide layer comprises Ni(SiGeSn).

* * * * *